(12) United States Patent
Felber

(10) Patent No.: US 6,739,494 B2
(45) Date of Patent: May 25, 2004

(54) DEVICE WITH ELECTRODES FOR THE FORMATION OF A BALL AT THE END OF A WIRE

(75) Inventor: Armin Felber, Lucerne (CH)

(73) Assignee: ESEC Trading SA, Cham (CH)

( * ) Notice: Subject to any disclaimer, the term of this patent is extended or adjusted under 35 U.S.C. 154(b) by 0 days.

(21) Appl. No.: 10/455,657

(22) Filed: Jun. 5, 2003

(65) Prior Publication Data
US 2003/0234271 A1 Dec. 25, 2003

(30) Foreign Application Priority Data
Jun. 20, 2002 (CH) .................................. 1071/02

(51) Int. Cl.[7] ............................................. B23K 37/00
(52) U.S. Cl. ......................................... 228/4.5; 219/56.1
(58) Field of Search ............................... 228/4.5, 180.5; 219/56, 56.1, 56.21, 56.22; 257/E21.518

(56) References Cited

U.S. PATENT DOCUMENTS 4,594,493 A    6/1986  Harrah et al.
4,909,427 A    3/1990  Plaisted et al.
5,037,023 A    8/1991  Akiyama et al.
5,110,032 A *  5/1992  Akiyama et al. ........... 228/102
5,263,631 A   11/1993  Felber

FOREIGN PATENT DOCUMENTS

GB    2086297   *   5/1982

* cited by examiner

Primary Examiner—Kiley Stoner
Assistant Examiner—Jonathan Johnson
(74) Attorney, Agent, or Firm—McCormick, Paulding & Huber LLP

(57) ABSTRACT

A device with electrodes for the formation of a ball at the end of a wire protruding out of a capillary comprises a first electrode which has a tip and at least one further electrode. The first electrode and the at least one further electrode are electrically connected. The distance between the tip of the first electrode and the end of the wire is smaller than the distance between any point on the at least one further electrode and the end of the wire.

2 Claims, 2 Drawing Sheets

DEVICE WITH ELECTRODES FOR THE FORMATION OF A BALL AT THE END OF A WIRE

CROSS REFERENCE TO RELATED APPLICATION

Figure 1:
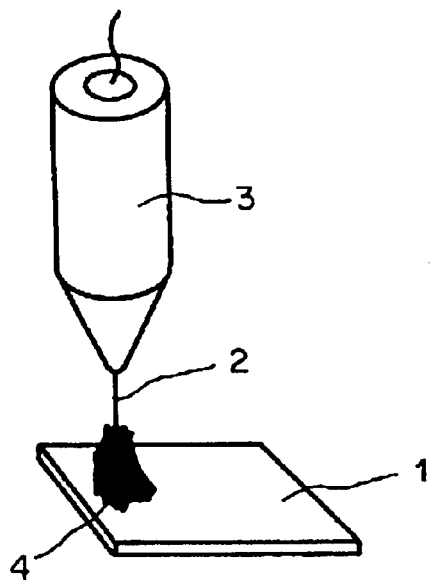

Applicant hereby claims foreign priority under 35 U.S.C. §119 from Swiss Application No. 2002 1071/02 filed Jun. 20, 2002, the disclosure of which is herein incorporated by reference.

FIELD OF THE INVENTION

The invention concerns a device with electrodes for the formation of a ball at the end of a wire.

BACKGROUND OF THE INVENTION

Such devices are used on so-called Wire Bonders. A Wire Bonder is a machine with which semiconductor chips are wired after mounting on a substrate. The Wire Bonder has a capillary which is clamped to the tip of a horn. The capillary serves to secure the wire to a connection point on the semiconductor chip and to a connection point on the substrate as well as to guide the wire between the two connection points. On producing the wire connection between the connection point on the semiconductor chip and the connection point on the substrate, the end of the wire protruding out of the capillary is first melted into a ball. Afterwards, the wire ball is secured to the connection point on the semiconductor chip by means of pressure and ultrasonics. In doing so, ultrasonics is applied to the horn from an ultrasonic transducer. This process is called ball bonding. The wire is then pulled through to the required length, formed into a wire loop and welded to the connection point on the substrate. This last part of the process is called wedge bonding. After securing the wire to the connection point on the substrate, the wire is torn off and the next bonding cycle can begin.

In order to form the end of the wire protruding out of the capillary into a ball, a high DC voltage is applied between the wire and the electrode so that an electrical spark occurs which melts the wire. The voltage at which the electrical breakdown of the ionised air takes place between the wire and the electrode and the spark is created is designated as sparking voltage.

Today, three types of devices are known for the formation of a wire ball at the end of a wire which prevail on the market. These three types are explained based on FIGS. 1 to 3. With the first type (FIG. 1), a flat electrode 1 is swivelled from the side under the capillary 3 which guides the wire 2. With this arrangement of electrode and wire, the electrical spark 4 is formed in the longitudinal direction of the wire. The electrical spark 4 therefore runs symmetrically to the wire. The advantage of this type is that the symmetry of the formed ball is comparatively high. On the other hand, the disadvantage is that the swivelling in and out of the electrode costs time. Furthermore, the swivelling in and out of the electrode can stimulate oscillations of the bondhead.

With the second type (FIG. 2), an electrode I with a tip is arranged laterally offset underneath the capillary. With this arrangement, the electrical spark 4 runs non-symmetrically to the longitudinal axis of the wire which tends to lead to the formation of asymmetrical wire balls. However, the asymmetry of these wire balls has a predominant direction. This makes it possible to reduce the asymmetry with additional measures. In addition, this arrangement requires a higher sparking voltage in comparison to the first type. With the same vertical distance to the downholder plate which is located immediately below the device and holds the connection fingers on the substrate in position, this leads to a greater occurrence of electrical discharges on the downholder plate.

With the third type (FIG. 3), the electrode 1 is a rotationally symmetrical ring electrode. After formation of the wire ball, the capillary 3 is lowered down through the electrode. The advantage of this arrangement is that the voltage necessary for creating the electrical spark is lower than with the first two types. The disadvantage is that the place where the electrical spark 4 is created constantly changes. Wire balls formed with this arrangement also have a tendency towards asymmetries, however these asymmetries have no predominant direction.

A further device for the formation of a wire ball is known from U.S. Pat. No. 5,263,631. This device has three pointed electrodes which are separately electrically controlled in order to regulate the currents flowing through the individual electrodes. A similar device is known from U.S. Pat. No. 4,594,493. These devices produce simultaneously either three or four sparks. However, the positioning of the electrodes relative to each other is a complicated task because it must be ensured that really three or four sparks are generated.

Further devices for the formation of a wire ball are known from U.S. Pat. Nos. 4,909,427 and 5,037,023. U.S. Pat. No. 5,037,023 shows the use of different electrodes where a first electrode is used to form a wire ball and a second pair of electrodes is used to locally melt a portion of the isolation of the wire. The first electrode and the second pair of electrodes are not used in combination for the formation of the wire ball and they are sequently brought into their working positions to perform their task separately.

SUMMARY OF THE INVENTION

The object of the invention is to develop a device for the formation of a ball at the end of a wire which is distinguished by as low a sparking voltage as possible and with which wire balls can be produced the size of which varies as little as possible.

A device in accordance with the invention has a first electrode which has a tip and at least one additional electrode. All electrodes are mechanically rigidly connected with each other. The second electrode, or the further electrodes, influence the progression of the electrical field that is created between the end of the wire and the electrodes. All electrodes are connected together electrically and therefore lie on the same electrical potential. Furthermore, they are formed in such a way and arranged so that in any case the distance between the tip of the first electrode and the wire is less than the distance between the second electrode, or all further electrodes, and the wire. In this way it is ensured that only one single electrical spark is produced, namely between the wire and the tip of the first electrode. The advantage of the at least one additional electrode lies in that a clearly lower sparking voltage results than with prior art. As a result, the distance between the electrodes and the downholder plate can be reduced without increasing the risk of discharges. Therefore, for the formation of the wire ball, the capillary does not have to be raised so far so that the cycle time is reduced.

The at least one additional electrode can be open, ie, can have an open end, with or without tip. However, it is of advantage when the at least one additional electrode is a closed electrode, for example a ring-shaped electrode. A closed electrode has the advantage that the dispersion of the sparking voltage is less than with an open electrode which leads to less variation in the size of the wire ball.

In the following, embodiments of the invention are explained in more detail based on the drawing. The illustrations are not drawn to scale.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale.

Figure 2:
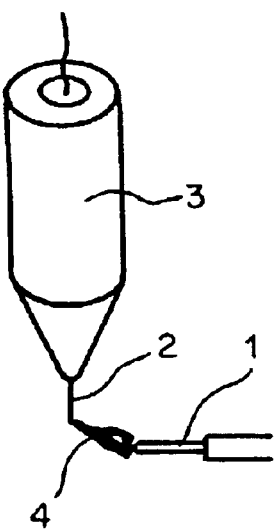
Figure 3:
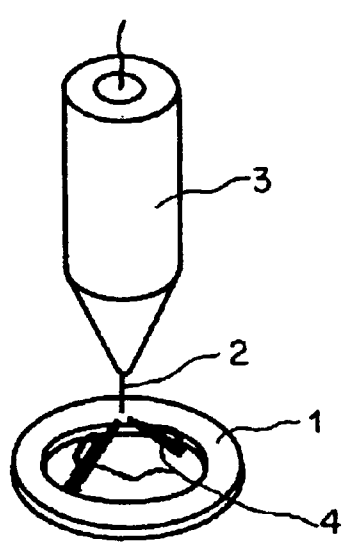
Figure 6:
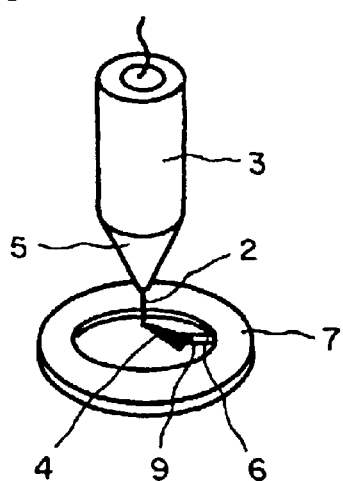
Figure 7:
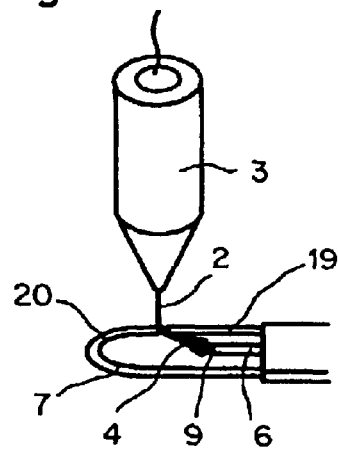
Figure 8:
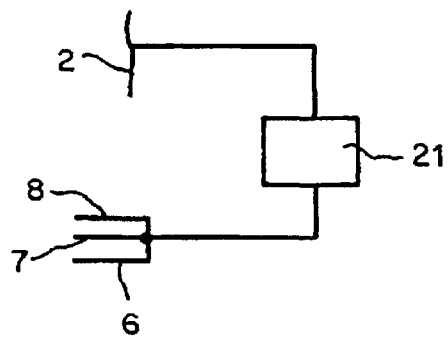

In the drawings:

FIGS. 1–3 show three types of devices of prior art for the formation of a wire ball at the end of a wire, FIGS. 4–7 show three different embodiments of a device in accordance with the invention for the formation of a wire ball at the end of a wire, and FIG. 8 shows an equivalent electrical block diagram.

DETAILED DESCRIPTION OF THE PREFERRED EMBODIMENTS

Figure 4:
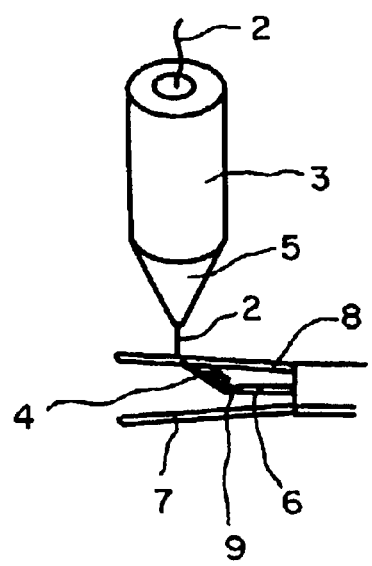

FIG. 4 shows a perspective view of a first embodiment of a device in accordance with the invention for the formation of a wire ball at the end of a wire 2 as can be used on a Wire Bonder. As described in the introduction, the wire 2 is guided by a capillary 3. At the start of a bonding cycle, one end of the wire 2 protrudes out of the tip 5 of the capillary 3. This wire end now has to be formed into a ball. The device has three electrodes 6–8 which are as well mechanically rigidly connected with each other as well as connected together electrically and therefore have the same electrical potential. The first electrode 6 is formed with a tip 9. When the capillary 3 has been raised and, in relation to the device, is located in the position in which the wire ball is to be formed, then the tip 9 of the first electrode 6 is located laterally offset underneath the tip of the capillary 3. In FIG. 4, the tip 9 of the first electrode 6 is located on one side, namely the right-hand side, of the capillary 3. The second electrode 7 and the third electrode 8 are longer than the first electrode 6 and extend as far as the other side of the capillary 3, in the example in FIG. 4 therefore, as far as the left-hand side of the capillary 3. The distance between any point on the second electrode 7 and the end of the wire 2 as well as the distance between any point on the third electrode 8 and the end of the wire 2 is greater than the maximum distance between the tip 9 of the first electrode 6 and the end of the wire 2. In doing so, it must be considered that the length of the piece of wire protruding out of the capillary 3 is subject to certain fluctuations and that this piece of wire can point in any direction.

The second and third electrodes 7 and 8 are to be formed without edges as peaks in the electrical field can be formed on edges. This limitation however is only valid for that area of the device where the electrical field is comparatively large. The limitation does not therefore apply for those parts of electrodes 7 and 8 which are furthest removed from the tip 5 of the capillary 3. The cross section of the second and third electrode is therefore preferably circular in shape.

Figure 5:
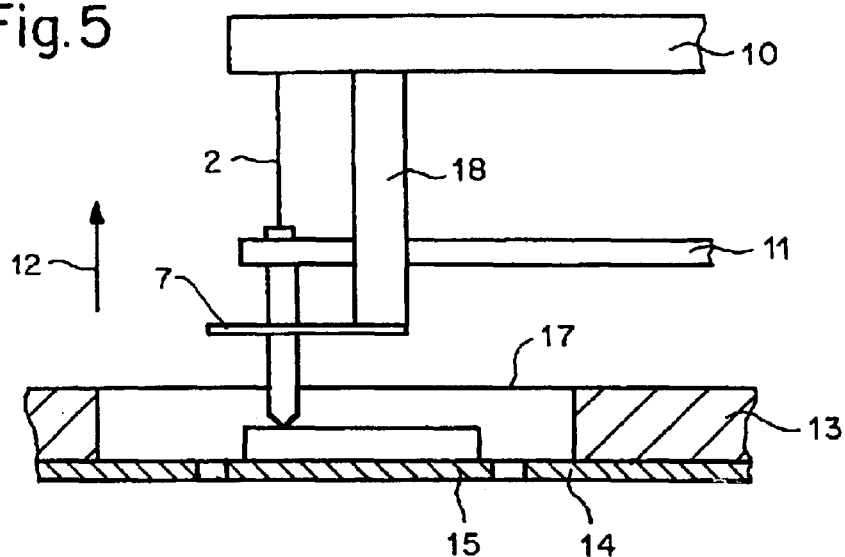

FIG. 5 shows a side view of a device used on a Wire Bonder. The Wire Bonder comprises a bondhead 10 with a horn 11 at the tip of which the capillary 3 is clamped. The horn 11 can be moved in vertical direction 12 relative to the bondhead 10. A so-called downholder plate 13 is located underneath the device with which connection fingers 14 of a substrate 15 onto which a semiconductor chip 16 is mounted are fixed in position. In the example shown, the three electrodes 6–8 are located in one plane (only electrode 7 is visible) which runs parallel to the surface 17 of the downholder plate 13. However, it is also possible to arrange the two electrodes 7 and 8 in a different plane to the first electrode 6. The electrodes 6–8 are secured to the bondhead 10 via an insulating body 18. The capillary 3 is lowered onto a connection point on the semiconductor chip 16.

FIG. 6 shows a perspective view of a second embodiment of a device in accordance with the invention for the formation of a wire ball at the end of a wire 2. This device only has the first electrode 6 and the second electrode 7 which are mechanically rigidly connected with each other. The first electrode 6 again has the tip 9. The second electrode 7 is ring-shaped and is therefore a closed electrode. The two electrodes 6 and 7 are located in one plane which runs underneath the tip 5 of the capillary 3 and parallel to the surface 17 (FIG. 5) of the downholder plate 13. The centre of the ring-shaped electrode 7 is located underneath the tip 5 of the capillary 3. The first electrode 6 is longer than the maximum length of the section of wire protruding out of the capillary 3. The electrical spark 4 therefore always occurs between the tip 9 of the first electrode 6 and the wire 2. The edges of the ring of electrode 7 are preferably rounded, ie, formed without edges. However, this characteristic is not visible in FIG. 6.

FIG. 7 shows a perspective view of a third embodiment of a device in accordance with the invention for the formation of a wire ball at the end of a wire 2. This device also has only the first electrode 6 and the second electrode 7 which are mechanically rigidly connected. The first electrode 6 again has the tip 9. The second electrode 7 comprises two sections 19 running parallel to the first electrode 6 which are connected by an arc 20. Therefore, the second electrode 7 is also a closed electrode. The two electrodes 6 and 7 are located in a plane which runs underneath the tip 5 of the capillary 3 and parallel to the surface 17 (FIG. 5) of the downholder plate 13. The two electrodes 6 and 7 are again dimensioned so that the electrical spark 4 always occurs between the tip 9 of the first electrode 6 and the wire 2.

After formation of the wire ball, the capillary 3 is lowered down between the open electrodes 7 and 8 (embodiment 1) or through the closed electrode 7 (embodiments 2 and 3) to the corresponding connection point on the semiconductor chip 16 where the wire ball is attached.

FIG. 8 shows the equivalent electrical block diagram. The wire 2 and all electrodes 6–8 for the first embodiment or 6 and 7 for the second and third embodiments are connected by means of a spark generator 21 known from the prior art. Basically, the spark generator consists of a constant current source. In order to form the electrical spark 4 between the end of the wire and the first electrode 6, the air between them has to be ionised until an electrical discharge takes place and therefore the spark 4 is created. To do so, an increasing direct voltage is built up over the constant current source until the discharge takes place. Two factors are mainly decisive for the size of the wire ball formed. One factor is the electrical energy which, on build-up of the direct current, is produced and stored in the connecting cable between the constant current source and the electrodes 6–8. As soon as the electrical spark 4 is created, this energy is discharged into the wire ball being formed. The second factor is the amount of current delivered by the constant current source from the creation of the spark up to conclusion of the ball forming process which can be controlled by means of the specified current intensity and the time duration. The energy which is built up in the connecting cable and which, on creation of the spark, is stored and then discharged, can not be controlled. The devices in accordance with the invention all have the advantage that, especially when the second electrode 7 is a closed electrode, on the one hand, the sparking voltage and, on the other hand, also its dispersion is considerably lower than with prior art. The greatly reduced variation of the sparking voltage results in exactly such a reduction in the variation of the energy stored in the connecting cable up to discharge and therefore also in a reduction in the variation in the size of the wire ball formed.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A device with electrodes for the formation of a ball at an end of a wire protruding out of a capillary, the device comprising a first electrode having a tip and at least one further electrode, the first electrode and the at least one further electrode mechanically rigidly connected with each other and electrically connected, whereby a distance between the tip of the first electrode and the end of the wire is smaller than a distance between any point on the at least one further electrode and the end of the wire for having an electrical spark generated only between the tip of the first electrode and the wire.

2. The device according to claim 1, comprising only one single further electrode which has a closed form.

* * * * *